(12) United States Patent
Hussain et al.

(10) Patent No.: US 6,449,751 B1
(45) Date of Patent: Sep. 10, 2002

(54) METHOD OF ANALYZING STATIC CURRENT TEST VECTORS WITH REDUCED FILE SIZES FOR SEMICONDUCTOR INTEGRATED CIRCUITS

(75) Inventors: Hunaid Hussain; Pradipta Ghosh, both of Milpitas; Arun K. Gunda, San Jose, all of CA (US)

(73) Assignee: LSI Logic Corporation, Milpitas, CA (US)

(\*) Notice: Subject to any disclaimer, the term of this patent is extended or adjusted under 35 U.S.C. 154(b) by 0 days.

(21) Appl. No.: 09/879,417

(22) Filed: Jun. 12, 2001

Related U.S. Application Data
(60) Provisional application No. 60/227,132, filed on Aug. 22, 2000.

(51) Int. Cl.[7] .............................................. G06F 17/50
(52) U.S. Cl. ............................. 716/4; 716/12; 716/18
(58) Field of Search .................................. 716/4, 12, 18

(56) References Cited

U.S. PATENT DOCUMENTS 6,324,678 B1 * 11/2001 Dangelo et al. .............. 716/18
6,345,379 B1 * 2/2002 Khouja et al. ................. 716/4
6,378,123 B1 * 4/2002 Dupenloup ................... 716/18

\* cited by examiner

Primary Examiner—Trong Phan
(74) Attorney, Agent, or Firm—Westman, Champlin & Kelly (57) ABSTRACT

A method and apparatus are provided for analyzing test vectors for use in measuring static current consumed by an integrated circuit. A netlist of interconnected cells is read to identify cell types used within the netlist, wherein the netlist includes a plurality of nodes. Once the netlist has been read, cell characteristics for selected ones of the cell types are read from a technology library to identify pins of the selected cell types to be monitored. The nodes in the netlist that correspond to these pins are identified and are added to an list file. Once the list file has been generated, a computer simulation program is used to simulate a steady-state response of a functional model of the integrated circuit to a potential test vector and to output the resulting logic states on the nodes provided in the list file.

22 Claims, 6 Drawing Sheets

```
400                                          ┌─402   ┌─404
   ↘ static_power power condition ( <pinname>  <val> ) {
                  average_current {
                      simtime {
                          <val>
                      }        ╲─406
                      <val>
                  } on <power source>;
              }
          }
```

METHOD OF ANALYZING STATIC CURRENT TEST VECTORS WITH REDUCED FILE SIZES FOR SEMICONDUCTOR INTEGRATED CIRCUITS

CROSS-REFERENCE TO RELATED APPLICATION

This application claims the benefit of U.S. Provisional Application Ser. No. 60/227,132, entitled "METHOD FOR REDUCING VCD FILE SIZE FOR IDDQ TESTING," filed Aug. 22, 2000, and published in English.

FIELD OF THE INVENTION

The present invention relates to testing integrated circuits for potential fabrication faults. More specifically, the present invention relates to a method of analyzing potential test vectors for use in static current testing of integrated circuits.

BACKGROUND OF THE INVENTION

Static current testing has been used to detect potential fabrication faults in complementary metal-oxide semiconductor (CMOS) circuits. Static current testing is based on an assumption that a fault-free CMOS circuit draws very little supply current in a steady state. This current is know as "leakage" current. Certain manufacturing faults on an integrated circuit cause unwanted shorts within the devices fabricated on the integrated circuit. Under certain test conditions, these shorts can cause an increase in the current drawn by the integrated circuit. A faulty integrated circuit often draws current that is several orders of magnitude greater than that drawn by a non-faulty integrated circuit.

Therefore, the leakage current drawn by an integrated circuit under certain test conditions can be used to indicated the presence of a manufacturing defect in the circuit.

Static current testing is performed by applying test vectors to the integrated circuit and making multiple current measurements during a quiescent state of the circuit. A test vector is typically applied to the circuit by serially shifting the test vector into the circuit through a chain of "scannable" elements and then clocking the circuit. The test vectors that are used for static current testing must contain vectors that will put the circuit into a low drain current ($I_{DD}$) state. Static current testing is often referred to as $I_{DDQ}$ testing.

Once the circuit is in the desired state, the circuit is "strobed" near the end of a clock cycle. That is, a snap shot of the circuit is taken, and the status of selected pins and nets is recorded along with the stability of the circuit. The strobe point for each $I_{DDQ}$ test vector is usually the last time unit in the clock cycle. If the state of the circuit at a particular strobe point is such that a defect-free chip in that state would not draw supply current, then the test vector and the resulting test patterns obtained at that strobe point can be successfully used for $I_{DDQ}$ testing.

When selecting which test vectors can be used for static current testing of an integrated circuit, the response of the circuit to the potential test vectors is simulated on a functional model of the integrated circuit. Each test vector is scanned into the functional model, the model is then "clocked" and the resulting states on all pins, nets, etc. within the model are recorded at multiple instants in time. The recorded states are output in the form of a value change dump (VCD) file. The states in the VCD file are then analyzed to determine whether the particular vector is a candidate for $I_{DDQ}$ testing. An $I_{DDQ}$ analyzer checks the states of the circuit against a set of rules to determine whether the circuit would draw current in that state. If not, the vector producing that state is a potential test vector for the $I_{DDQ}$ test.

Due to the number of logic cells and nets in a typical integrated circuit, the VCD file sizes can become huge. One factor that contributes to the large file sizes is that all pins, nets, etc. are dumped for each test vector. With 100,000 gates or more being integrated on a single circuit, the number of recorded states can be in the millions. Also, the same physical net may be known by different logical names in the logical description of the circuit. For example, several different logical nets can be connected together to form a single physical net. If the states on each logical net in the netlist are recorded, the resulting VCD file will have a large number of redundantly recorded states.

The large VCD file sizes impair design turn-around time and reduce overall productivity in selecting test vectors. Thus, an improved method of analyzing potential static current test vectors, which produces reduced VCD file sizes, is desired.

SUMMARY OF THE INVENTION

One aspect of the present invention relates to a method of analyzing test vectors for use in measuring static current consumed by an integrated circuit. According to the method, a netlist of interconnected cells is read to identify cell types used within the netlist, wherein the netlist includes a plurality of nodes.

Cell characteristics for selected ones of the cell types are read from a technology library to identify pins of the selected cell types to be monitored. A list of the nodes in the netlist that correspond to the identified pins is then generated. A computer software simulation program simulates a response of a functional model of the integrated circuit to a potential test vector and outputs logic states of the nodes in the list when the functional model is in a substantially steady state.

Another aspect of the present invention relates to a computer-aided design tool for analyzing static current test vectors for use in measuring static current consumed by an integrated circuit. The tool reads a netlist of interconnected cells to identify cell types used within the netlist, wherein the netlist includes a plurality of nodes. The tool also reads cell characteristics for selected ones of the cell types from a technology library to identify pins of the selected cell types to be monitored and then generates a list of the nodes in the netlist that correspond to the identified pins. Once the list has been generated, the tool simulates a response of a functional model of the integrated circuit to a potential test vector and outputs logic states of the nodes in the list when the functional model is in a substantially steady state.

Another aspect of the present invention relates to a computer readable medium having instructions readable by a programmable computer which, when executed, cause the computer to perform steps including: (a) reading a netlist of interconnected cells to identify cell types used within the netlist, wherein the netlist includes a plurality of nodes; (b) for selected ones of the cell types, reading a technology library to identify any pins of the selected cell types that are listed as having a required logic state to place that cell type in a static power condition; and (c) generating an output computer file which lists the nodes in the netlist that correspond to the pins identified in step (b) and excludes at least some of the other pins of the selected cell types.

Yet another aspect of the present invention relates to a method of analyzing test vectors for use in measuring static current consumed by an integrated circuit. The method includes: (a) reading a netlist of interconnected cells to identify cell types used within the netlist, wherein the netlist includes a plurality of nodes; (b) identifying pins of selected ones of the cell types to be monitored; (c) for each pin identified in step (b), (c)(1) identifying a net name for a net coupled to that pin in the netlist, (c)(2) locating any top net name within the netlist that is coupled to the net, (c)(3) adding the top net name to an output list if the top net name is located in step (c)(2), and (c)(4) adding the net name identified in step (c)(1) to the output list if no top net name is located in step (c)(2); (d) simulating a response of a functional model of the integrated circuit to a potential test vector with a computer software simulation program; and (e) outputting logic states from the simulation program when the functional model is in a substantially steady state for the net names that are listed in the output list.

DETAILED DESCRIPTION OF ILLUSTRATIVE EMBODIMENTS

Figure 1:
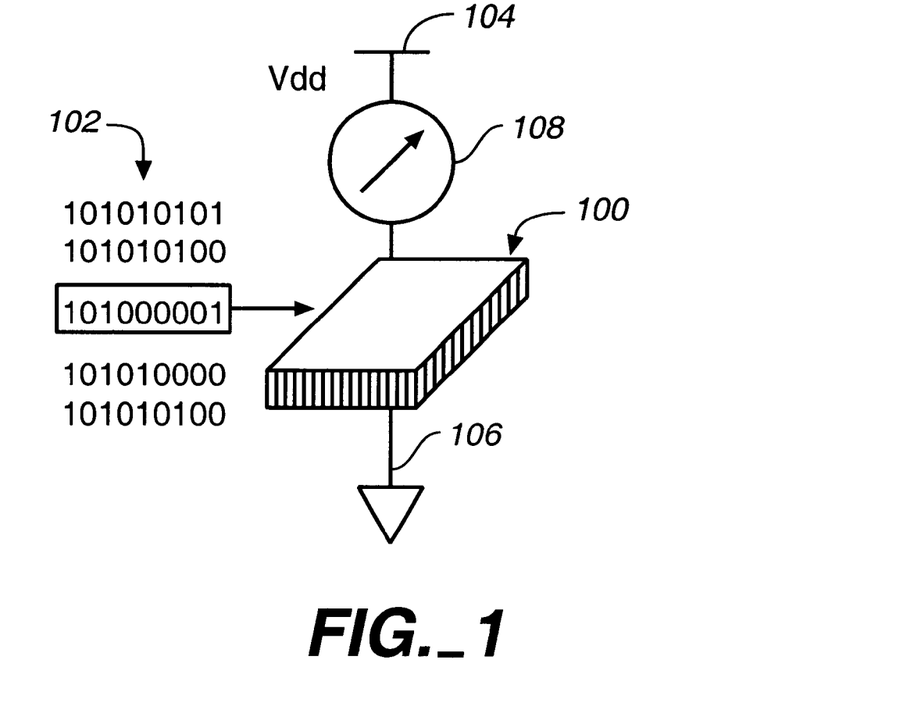
FIG. 1 is a simplified, schematic diagram illustrating static current testing of an integrated circuit according to one embodiment of the present invention.

FIG. 1 is a simplified, schematic diagram illustrating static current testing of an integrated circuit 100 according to one embodiment of the present invention. Static current testing is performed by applying test vectors 102 to integrated circuit 100 and making multiple current measurements during a quiescent or steady state of the circuit. Static current testing can be applied at a wafer level, a packaged device level, during incoming inspection, during lifetime tests, or during on-line testing.

Integrated circuit 100 is electrically coupled to a text fixture (not shown) 10 which supplies power to the integrated circuit through voltage supply terminals 104 and 106. The test fixture also sets selected inputs to the circuit to a known state and supplies the test vectors 102 for performing the test. A current sensor 108 is coupled in series between voltage supply terminal 104 and one of the power supply pads of integrated circuit 100 for measuring the resulting current drawn by integrated circuit 100.

In one embodiment, each test vector 102 is applied to circuit 100 by serially shifting the test vector into the circuit through a chain of "scannable" elements and then clocking the circuit through its clock input pins. The scannable elements are formed in integrated circuit 100 by including extra logic and a multiplexer to selected sequential elements in the circuit. Each scannable element selects data from a normal data input or a test data input based on a test enable signal provided to integrated circuit 100. The scannable elements are connected together in series to form a scan chain by connecting the output of each scannable element to the test data input of the next, subsequent scannable element in the chain.

When the test enable input to the circuit is activated, the scannable elements switch from the normal data flow mode to the scan mode. Each scannable element is controlled to select data from the test data input as opposed to the normal data input. One of the test vectors 102 is then loaded into the scannable elements by serially shifting the test vector through the scan chain. After the test vector is loaded, the test enable input is deactivated and the scannable elements switch from the scan mode the normal data flow mode. The circuit is then clocked, and current sensor 108 measures the current drawn by circuit 100 after the circuit has returned to a steady state.

The test vectors that are used for static current testing are selected to put circuit 100 into a state such that all sources of DC current in circuit 100 are shut off and the circuit draws little or no drain current through its transistors. Test vectors 102 attempt to initialize circuit 100 so that all design nodes, including enable and control pins of bidirectional buffers and tri-state output buffers are reset. Bus holders are conditioned to a known state. No bus contention or bidirectional conflicts are allowed. Similarly, no floating conditions are allowed. All current-drawing cells, including high-density random access memories (RAMS) are shut off.

Once circuit 100 is in a steady state following application of an individual test vector 102 to the circuit, the DC current drawn through power supply terminals 104 and 106 is measured. If the current exceeds a specified tolerance, there may be a short or some other fault condition in integrated circuit 100. Such a fault can cause a functional failure in the circuit or may have an adverse effect on the lifetime and reliability of the circuit.

Figure 2:
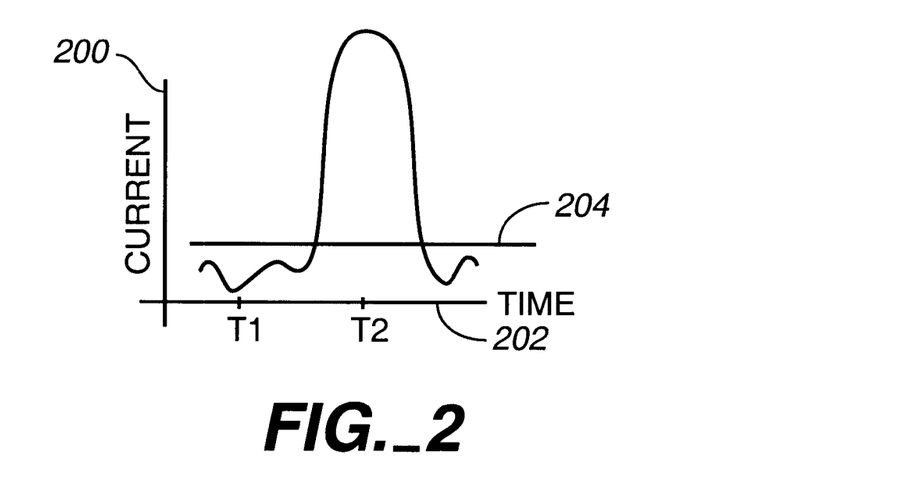
FIG. 2 is a graph illustrating leakage current drawn by the integrated circuit as measured by a current sensor as a function of time.

FIG. 2 is a graph illustrating the leakage current measured by current sensor 108 (shown in FIG. 1) on axis 200 as a function of time on axis 202. Attime T1, a first vector has been scanned into integrated circuit 100 (also shown in FIG. 1), and the circuit has received a rising clock edge on its clock input. At time T2, integrated circuit 100 has reached a steady state following the clock edge that was received at time T1. Line 204 represents a threshold current which is indicative of a maximum leakage current that would be drawn by a non-faulty integrated circuit. Since the steady state current level 206 drawn by integrated circuit 100 exceeds current threshold 204, integrated circuit 100 is assumed to have a manufacturing fault.

When selecting test vectors for use in static current testing, the response of the circuit to each potential test vector is simulated on a functional model of the circuit. Each test vector is scanned into the functional model, the model is "clocked", and the resulting states on selected nodes within the model are recorded at multiple instants in time. The recorded states are analyzed against a predetermined set of rules to determine whether the circuit would draw current in that state. If not, that test vector is a potential test vector for static current testing.

Figure 3A:
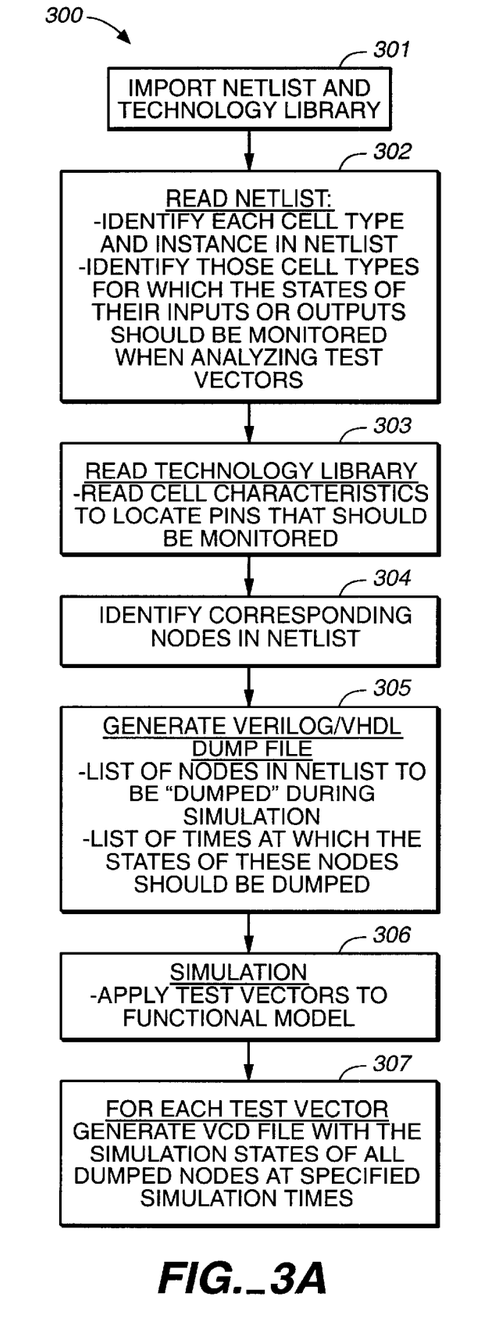
FIG. 3A is a flow diagram depicting steps for identifying nets to be dumped and simulating resulting logic states on those nets from the application of potential test vectors on a functional model of the integrated circuit, according to one embodiment of the present invention.
Figure 3B:
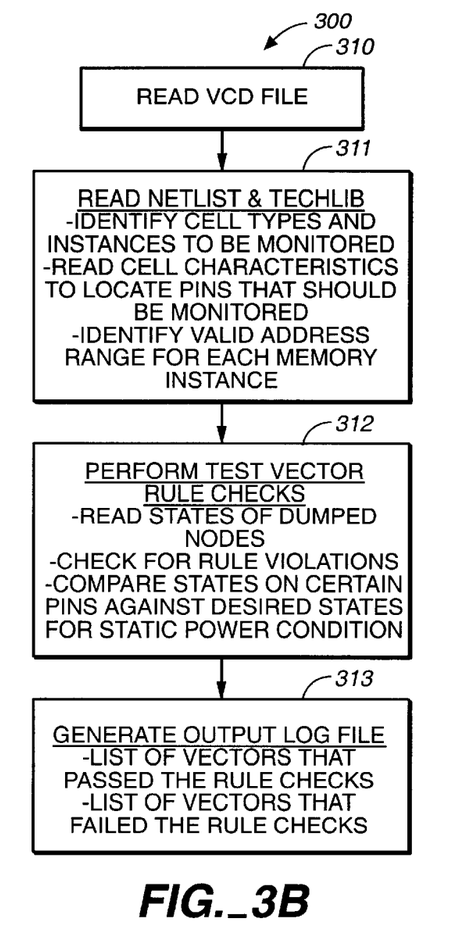
FIG. 3B is a flow diagram depicting steps for checking the resulting logic states with a set of static current test rules, according to one embodiment of the present invention.

FIGS. 3A and 3B are flow diagrams depicting a method 300 for analyzing potential test vectors for use in static current testing, according to one embodiment of the present invention. The steps performed in FIGS. 3A and 3B can be performed by a single computer-aided design tool or with multiple tools that interact with one another either directly or through suitable output files.

At step 301, a netlist and a semiconductor technology library for the integrated circuit is received. The netlist includes a list of all cells within the integrated circuit and the interconnections between the cells. These cells are selected from the technology library, which is typically provided by the semiconductor manufacturer. The cells in the technology library are defined by cell library definitions. Each cell library definition includes cell layout definitions and characteristics. The cell layout definition includes a layout pattern of the transistors in the cell, geometry data for the cell's transistors, cell routing data and information regarding the cell's inputs and outputs. The cell characteristics include a cell propagation delay and a model of the cell's function.

At step 302, a pre-processing tool uses a netlist reader to read the netlist received at step 301 and identifies each cell type and instance within the netlist. The pre-processing tool then identifies those cell types for which the states of their inputs or outputs should be monitored when testing potential static current test vectors. In one embodiment, the pre-processing tool identifies three categories of cells for monitoring: input-output buffers, tri-state buffers and cells that are capable of drawing current while in a steady state. The term "input-output buffers" can include input only, output only, and bidirectional buffers. Static current-drawing cells can include high-speed input-output buffers, phase-locked loops, high-density RAMs, slew-rate buffers, and other cells. Such "current-drawing" cells can have particular requirements for the logic states of some or all of their inputs so that these cells are switched off or otherwise placed in a low current-drawing state. For these cell types, the cell characteristics that are provided with the technology library include a list of the pins that have a "static power condition" and the respective logic state values that are required for those pins. If these pins are not in the required state, the cell can potentially draw current when the cell is in a steady state.

Figure 4:
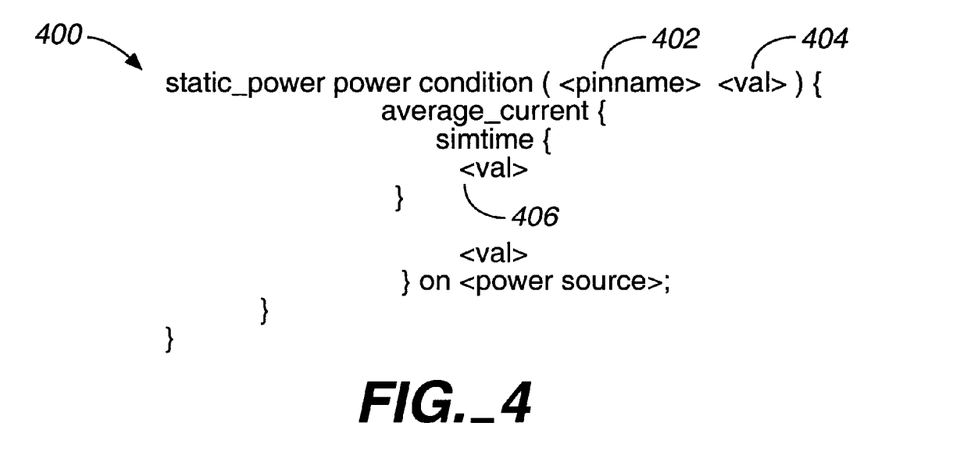
FIG. 4 is a diagram illustrating a portion of the cell characteristics provided with the technology library for a cell type having a static power condition.

FIG. 4 is a diagram illustrating a portion of the cell characteristics provided with the technology library for a static current-drawing cell type having a static power condition 400. Static power condition 400 includes a list of pin names 402 and respective values 404 for the pins in the cell having a particular logic state requirement for operating the cell in a low current-drawing state. Each pin name 402 that is included in static power condition 400 is identified in step 303 so that its state can be monitored during simulation to verify whether the test vector being analyzed has placed the cell in the low current-drawing state. Static power requirement 400 can also include a list of simulation times 406 at which the logic states of these pins should be recorded.

In addition, for integrated circuits having embedded memories, these memories can draw static current if a particular test vector attempts to address a memory location that is not physically present in the memory. The preprocessing tool therefore identifies each memory cell in the netlist and the locations of all memory address pins on each cell type so that the resulting logic states on these pins can be checked against valid address ranges for the memories.

Referring back to step 303 of FIG. 3A, the pre-processing tool uses a technology library reader to read the cell characteristics from the technology library for the potentially current-drawing cells that were identified for monitoring in step 302 and identifies the pins that need monitoring. The remaining pins are ignored.

At step 304, the pre-processing tool locates each instance of the cell types identified in step 302 for monitoring and determines the net names (or nodes) that are connected to the pins that were identified in step 303. For example in one embodiment, the pre-processing tool determines the net names in the netlist that are coupled to the inputs and/or outputs of each input-output buffer, the inputs and/or outputs of each tri-state buffer, the pin names 402 listed in the static power condition 400 of each potentially static current-drawing cell, and the input address pins of each memory instance.

At step 305, the pre-processing tool generates a "dump" file containing the list of net names identified in step 304. The dump file can also include a list of times at which the states of these nodes should be monitored during simulation. The remaining nodes in the netlist are not included in the dump file. The dump file can have any suitable format, such as a Verilog or VHDL file format. Steps 302, 303, 304 and 305 can be performed simultaneously. As each new cell is considered by the pre-processing tool, the pre-processing tool can locate the pins that need monitoring and insert the corresponding net names in the dump file. When all cells have been considered, the dump file is complete.

At step 306, a simulation tool simulates the response of a functional model of the integrated circuit, as defined by the netlist and the technology library, to a series of potential test vectors to determine whether each test vector is a candidate for use in static current testing. The test vectors are typically provided with a test bench that has been developed for the particular integrated circuit design. As mentioned above, the simulation tool scans or otherwise loads each test vector into the functional model. The functional model is then "clocked", and the resulting states on the nodes listed in the dump file are recorded at one or more instants in time, at step 307. The strobe point for testing each potential static current test vector is usually the last time unit in the clock cycle. However, other strobe points can also be used. The simulation tool records the states in the form of a value change dump (VCD) file, which can have any suitable file format. Since only a subset of the nodes in the netlist are dumped at step 307, the VCD file has a size (e.g., the number of recorded states in the file) that is significantly smaller than VCD file sizes of the prior art.

The VCD file is then provided to a test vector rule checker tool, which checks the recorded simulation states of all dumped nodes against a set of predetermined static current testing rules. FIG. 3B is a flow chart illustrating the general steps performed by the rule checker tool. At step 310, the rule checker tool reads the contents of the VCD file for each potential test vector.

At step 311, the rule checker tool reads the netlist and the technology library to identify each cell type and instance to be monitored and the respective pins to be checked. For example, the tool can identify the respective pins of each input-output buffer, each tri-state buffer and each potentially static current-drawing cell in the netlist. For each potentially static current-drawing cell, the rule checker tool reads the static power condition 400 (shown in FIG. 4) for that cell to locate each of the pin names 402 and their corresponding logic values 404. For each memory, the rule checker tool also locates the input address pins.

At step 312, for each potential test vector the rule checker tool reads the states of the dumped nodes and checks those states against any desired logic state provided by the static power condition for the respective cell type and against a variety of other rules that indicate whether the particular test vector would place the integrated circuit in a sufficiently low current-drawing state. The tool produces a failure output for the potential test vector if any of the rules have been violated.

For embedded memories, such as high-density RAMs, the chip enable control pins are checked to determine whether they have been set correctly so that no current goes through the sense amplifiers or other active elements in the memory. During static current testing, the RAM's write enable, chip select, output enable, input address bits and data pins should be controlled either directly or through logic. Input pins generally can be a logic low or a logic high, but should not be switching. The output enable (oe) pin should be set such that the data outputs of the memory are in an active state. When driven to a logic low state, the data output pins of the memory will be in an undesired high-impedance state. If two or more memories are connected to the same bus, then at least one and only one of the memories, or some other device should be driving the bus to ensure that the bus is not left floating. The chip select (cs) pin of the memory should be disasserted prior to strobing for static current test vectors. When asserted, the chip select (cs) pin enables the sense amplifiers, which consume static current. Each of these pins that require a certain logic state during static current testing are listed in the static power condition 400 (shown in FIG. 4) for the memory, along with the desired value 404.

Although unknown logic states generally are not detrimental to static current testing, memory outputs should not be at unknown states so that good coverage of the memory logic can be achieved. Memories should be put into a transparent (past-through) mode or a sequential mode in which the output pins are at a logic low state or a logic high state when strobing occurs for static current testing. Sequential mode refers to an operation sequence in which one or more memory addresses are written to and then read from. To avoid unknown states on the memory output pins, the locations that are read from should be those that were written.

The tool also identifies a valid address range for each memory instance in the netlist and checks whether the recorded logic states on the input address pins correspond to an address that is within the valid address range. The tool produces a failure output for the potential test vector if those logic states correspond to an address outside the valid address range. In one embodiment, the logic states are compared against the address of the last addressable row in the memory device. If the logic states correspond to an address that exceeds the last addressable row, the tool generates a failure output. In addition, the rule checker tool produces a failure output for the potential test vector if any of the logic states of the input address bits are unknown logic states. An unknown logic state on an input address bit, depending on the location of the bit, implies that the address can potentially exceed the valid address range. Hence, this potential test vector is also discarded. Similarly, a high impedance logic state on an input address bit can also cause leakage current to flow within the memory. Therefore, the rule checker tool produces a failure output if any of the logic states of the input address bits are high impedance logic states.

The test vector rules can also check for a variety of other conditions. For example, a potential test vector should place the integrated circuit in stable state at the strobe point such that there are no pending events. Every input, output and bi-directional pin corresponding to an input or output of the integrated circuit can be checked to see that the pin is at a logic low or high state. If an input, output or bi-directional pin of the integrated circuit is pulled up, it should be at a logic high level, and if pulled down, it should be at a logic low level.

Cell-level nets internal to the integrated circuit that have been dumped, such as the inputs and outputs of tri-state buffers, can also be checked. When a net has only one driver (a gate with an output connected to the net), then the check is successful: if the net is at a low or high logic state; if the net is at an unknown state and the driver is not a tri-state driver; or the net is at an unknown state and driven by a tri-state gate whose enable pin is active. The check fails if the net is at a high impedance state since the net is considered to be floating.

The check also fails if the net is at an unknown state and driven by a tri-state gate whose enable pin is unknown (the net is considered to have a potential conflict).

Figure 5A:
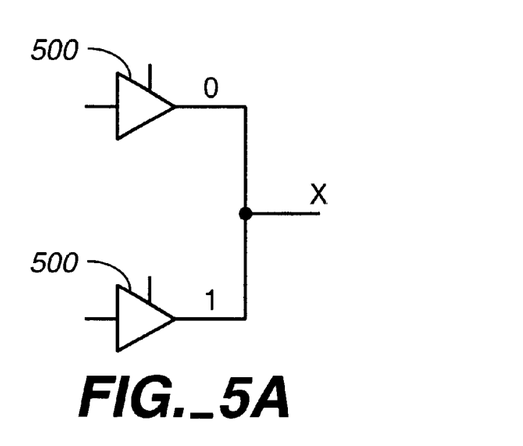
FIGS. 5A and 5B are diagrams of circuits having tri-state net drivers with outputs considered to be in conflict.
Figure 5B:
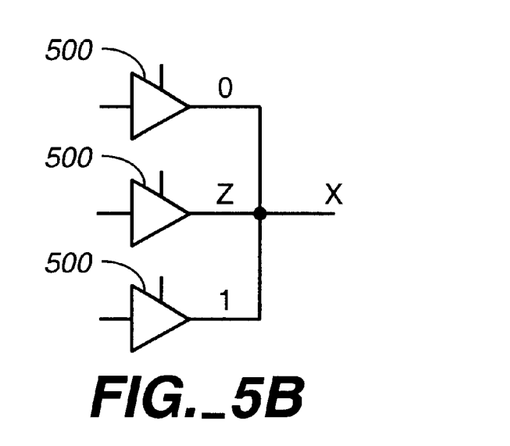

For a cell-level net having more than one driver, the check is successful if the net is at a logic low or high state. The check fails: if the net is at a high impedance state (floating); if the net is at an unknown state and the drivers are not tri-state drivers; or if the net is at an unknown state and the drivers are tristate drivers. If the net is at an unknown state and the drivers are tri-state drivers, the net is considered to be in conflict, in potential conflict, or floating, depending on the logic states at the outputs of the net drivers. FIGS. 5A and 5B are diagrams of circuits having tri-state net drivers 500. The nets in these two figures are considered to be in conflict since the nets are driven to both a logic "0" and a logic "1", where the "X" represents an unknown state, and the "Z" represents a high impedance state.

Figure 6A:
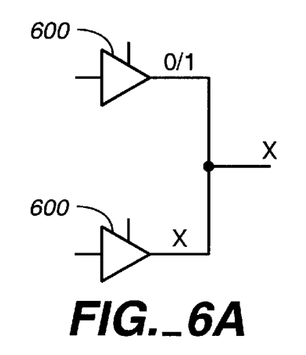
FIGS. 6A–6C are diagrams of circuits having tri-state net drivers with outputs considered to be in potential conflict.
Figure 6B:
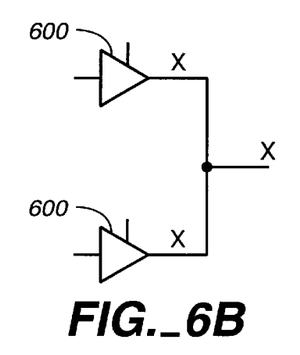
Figure 6C:
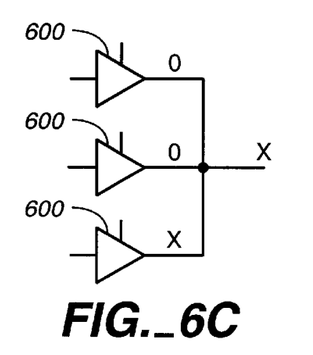
Figure 7A:
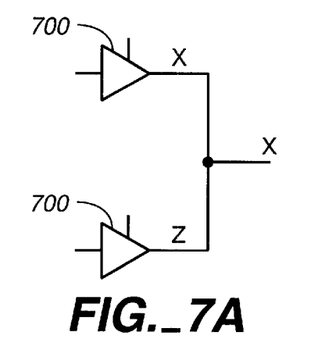
FIGS. 7A and 7B are diagrams of circuits having tri-state net drivers with outputs considered to be potentially floating.
Figure 7B:
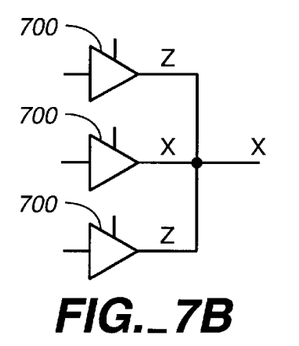

FIGS. 6A–6C are diagrams of circuits having tri-state net drivers 600 having outputs in which the nets are considered to be in potential conflict. Each net is not in conflict (it is in an unknown state), but there are multiple drivers 600 driving different logic values onto the net. FIGS. 7A and 7B are diagrams of circuits in which the nets are considered to be potentially floating. In this case the nets are driven to an unknown state "X" by a single driver 700, and all other drivers 700 coupled to that net are at a high impedance state "Z". Other sets of test vector rules can also be used in alternative embodiments.

Referring back to step 313 of FIG. 3B, the rule checker tool generates an output log and listing file, which provides a list of the test vectors that passed the rule checks and a list of test vectors that failed the rule checks. The test vectors that passed the rule checks are potential test vectors for use during static current testing of the integrated circuit after fabrication.

With large integrated circuits having many cells and nets, the sizes of the VCD dump files can become extremely large.

Such large file sizes reduces efficiency of the test vector selection and analysis process and adversely increases design turn-around time. These file sizes are reduced in several ways according to various embodiments of the present invention. Not every net in the netlist needs to be dumped. As described above, one embodiment of the present invention identifies only certain categories of cell types in a given netlist that must be monitored to verify whether a potential test vector can be used to perform a static current test on the integrated circuit. Also, only certain inputs or outputs of these cells need to be dumped. By reducing the number of pins and nets that are dumped during simulation, the VCD file sizes can be significantly reduced. The decision as to which pins and nets will be dumped is made by the pre-processing tool in steps 302–305 of FIG. 3A.

In one embodiment of the present invention, the VCD file size is further reduced by reducing the number of redundant net names that are dumped in the VCD file. The same physical net may be known by different names in the logical description of the circuit. For example, several different logical nets can be connected together to form a single physical net. If the states on each logical net in the netlist are recorded, the resulting VCD file will have a large number of redundantly recorded states.

Figure 8:
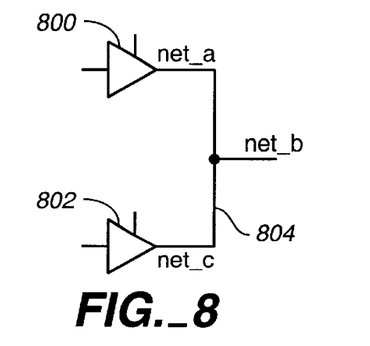
FIG. 8 is a schematic diagram illustrating two tri-state buffers having outputs that are coupled to the same physical net.

FIG. 8 is a schematic diagram illustrating two tri-state buffers 800 and 802 having outputs that are coupled to the same physical net 804. The output of buffer 800 may be referred to in the netlist as being coupled to a logical net named "net_a" while the output of buffer 802 may be referred to as being coupled to a logical net named "net_c". Logical nets net_a and net_b are coupled to "net_c". Therefore, net_a, net_b and net_c are the same physical net but are logically different from one another. One of these nets can be identified as a "top net" for use in higher levels of the netlist hierarchy. If all these redundant net names are dumped out during simulation, the resulting VCD file size will be huge.

According to one embodiment of the present invention, the preprocessing tool and the rule checker tool make use of the "top net" feature to dump only one net name for each physical net. So, regardless of which net among the three is dumped in subsequent vector runs, the rule checker tool does not need any further information about the states on the other two nets. This equivalent information is used to reduce the VCD file size without loss of information.

Figure 9:
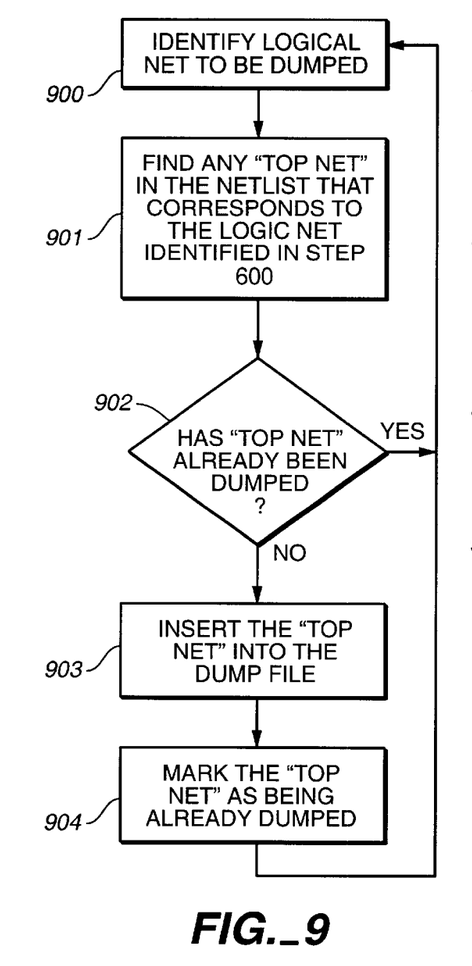
FIG. 9 is a flow chart illustrating a method of implementing a "top net" concept by a pre-processing tool within the method shown in FIG. 3A, according to one embodiment of the present invention.

FIG. 9 is a flow chart illustrating a method of implementing the "top net" concept by the pre-processing tool within the method shown in FIG. 3A, according to one embodiment of the present invention. At step 900, the pre-processing tool identifies a particular net in the netlist to be dumped. At step 901, the pre-processing tool reads the netlist to find any "top net" that is connected to the same physical net as the net identified in step 900. If a top net is found, the pre-processing tool checks its operating database, at step 902, to see whether that top net has already been inserted into the dump file during consideration of another net, pin or cell in the netlist. If so, the pre-processing tool returns to step 900 and no new entries are made in the dump file. If not, the pre-processing tool moves to step 903 and inserts the name of the top net into the dump file. The pre-processing tool marks that top net as having been "already dumped" in its operating database, at step 904, and returns to step 900.

This marking can be done by any suitable method, such as setting a software flag associated with the top net name, associating some other indicator with the top net, maintaining a list of "already dumped" top nets, or modifying the netlist to include an indicator that the top net has already been dumped. If there is no top net other than the net name presently being considered, the present net name is entered into the dump file. Thus, as each net is considered by the pre-processing tool, only one net name is entered in the dump file for each set of logical nets that are coupled to the same physical net, even if separate ones of these logical nets are identified for monitoring. This eliminates redundant entries in the VCD file, which reduces the file size.

Figure 10:
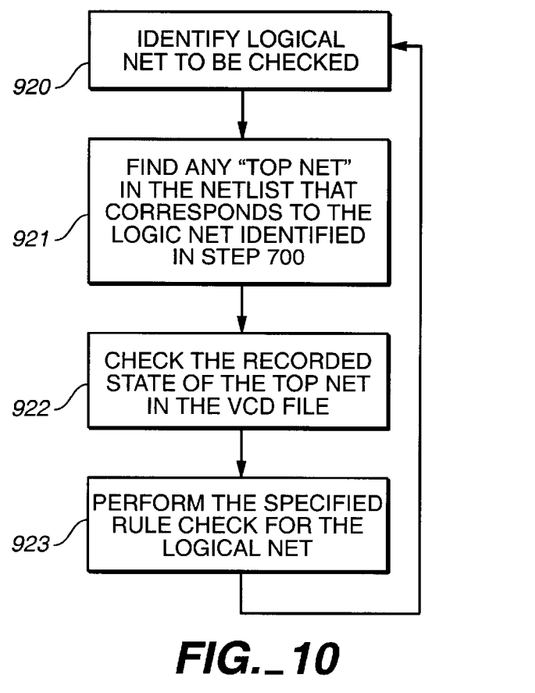
FIG. 10 is a flow chart illustrating steps performed by a rule checker tool for making use of the "top nets" within the method shown in FIG. 3B.

FIG. 10 is a flow chart illustrating steps performed by the rule checker tool for making use of the "top nets". As discussed above with reference to FIG. 3B, the rule checker tool reads the netlist and the technology library to identify particular nets in the netlist to be monitored. As each of these nets is identified, at step 920, the rule checker tool reads the netlist to find any top net that is associated with the same physical net, at step 921. The pre-processing tool then checks the recorded state of the top net from the VCD file, at step 922. At step 923, the rule checker tool checks the recorded state for the top net with the predetermined rules for the logical net being monitored.

For the example shown in FIG. 8, if all three nets, net_a, net_b and net_c, need monitoring, the VCD file will contain a single recorded state for all three nets. As the state of each logical net is checked, the rule checker tool reads the state of the associated top net from the VCD file. Since only one state is recorded or each physical net, the VCD file is significantly reduced.

Figure 11:
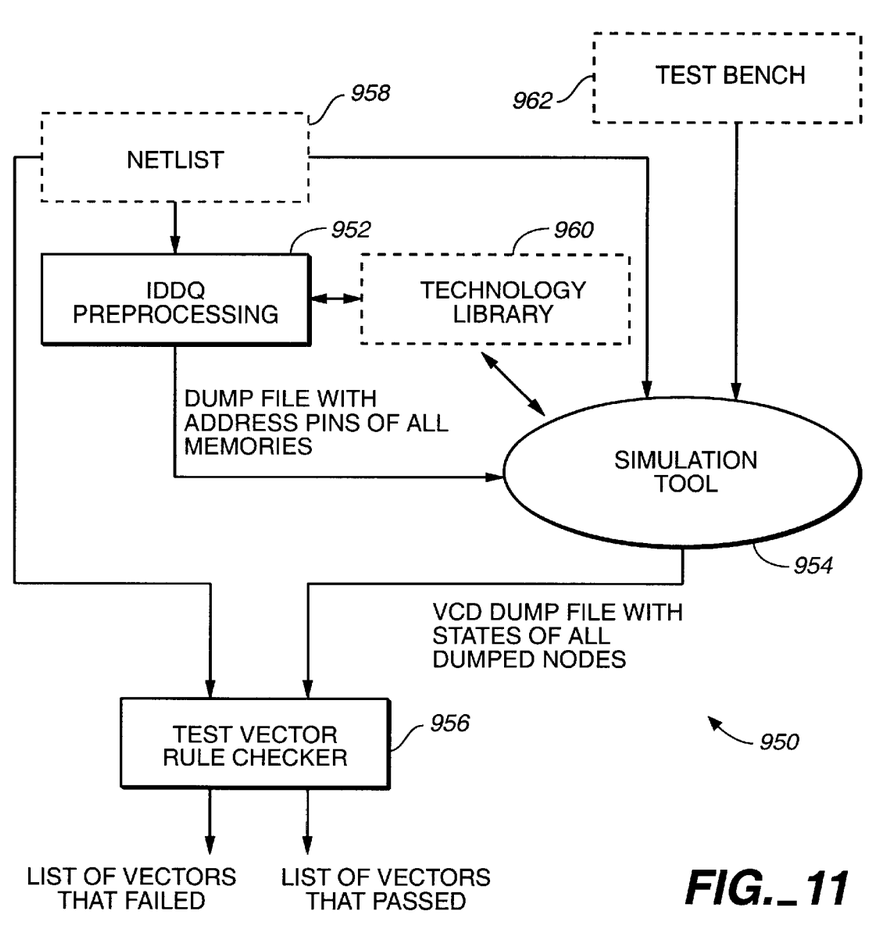
FIG. 11 is a block diagram of a static current test vector analysis apparatus according to one embodiment of the present invention.

FIG. 11 is a block diagram illustrating a static current test vector analysis tool 950 which can be used to perform the steps shown in FIGS. 3A, 3B, 9 and 10 according to one embodiment of the present invention. Tool 950 includes a pre-processing tool 952, a logic simulation tool 954 and a test vector rule checker tool 956. Pre-processing tool 952 reads netlist 958 and technology library 960 to identify each net in the netlist to be monitored and, for each net, identifies any associated top level net. Pre-processing tool 952 generates a Verilog or VHDL dump file containing a list of all nets in the netlist to be "dumped" during simulation. If there is a top level net associated with a particular node, then the top level net is used in the dump file. The dump file can also include a list of times at which the states of these nodes should be dumped. This dump file is provided to simulation tool 954. Simulation tool 954 receives potential test vectors from test bench 962 and simulates the response of the integrated circuit to each potential test vector based on netlist 958 and the cell characteristics and functional models received from technology library 960. At the specified simulation times, simulation tool 954 generates a VCD dump file containing the states of all nodes listed in the dump file generated by pre-processing tool 952. The VCD dump file is provided to test vector rule checker 956, which analyzes the recorded states based on a predetermined set of rules, as discussed above. Rule checker tool 956 generates a log and listing file that identifies all vectors that passed the checks and all vectors that failed the test. The vectors that passed the rule checks of rule checker 956 are candidates for use during static current testing following fabrication of the integrated circuit.

Although the present invention has been described with reference to preferred embodiments, workers skilled in the art will recognize that changes may be made in form and detail without departing from the spirit and scope of the invention. For example, individual steps shown in FIGS. 3A, 3B, 9 and 10 or individual elements shown in FIG. 11 can be implemented in software, hardware, or a combination of both hardware and software. One or more of the steps or elements can be implemented on a computer-readable medium containing instructions which, when executed on a computer, cause the computer to perform the described functions.

What is claimed is:

1. A method of analyzing test vectors for use in measuring static current consumed by an integrated circuit, the method comprising:

(a) reading a netlist of interconnected cells to identify cell types used within the netlist, wherein the netlist includes a plurality of nodes;

(b) reading cell characteristics for selected ones of the cell types from a technology library to identify pins of the selected cell types to be monitored;

(c) generating a list of the nodes in the netlist that correspond to the pins identified in step (b);

(d) simulating a response of a functional model of the integrated circuit to a potential test vector with a computer software simulation program; and (e) outputting logic states of the nodes in the list that were generated in step (c) from the simulation program when the functional model is in a substantially steady state.

2. The method of claim 1 wherein the netlist comprises at least one instance of a plurality of different cell types and wherein step (b) comprises:

(b)(1) comparing the plurality of different cell types against a predefined cell type criteria;

(b)(2) identifying only the cell types that satisfy the predefined cell type criteria; and (b)(3) reading the cell characteristics for at least one of the cell types identified in step (b)(2) from the technology library to identify pins of that cell type to be monitored.

3. The method of claim 2 wherein:

step (c) comprises generating a list of the nodes in the netlist that correspond to pins of the cell types identified in step (b)(2), including the pins identified in step (b)(3); and step (e) comprises outputting logic states of only the nodes in the list generated in step (c) within the functional model in response to the potential test vector.

4. The method of claim 3 wherein the cell types that satisfy the predefined cell type criteria consist of only input-output buffers, tri-state buffers and the cell types that can potentially draw current when that cell type is in the substantially steady state.

5. The method of claim 4 wherein the cell types that satisfy the predefined cell type criteria include memory cells, phase-locked loop cells and slew-rate buffers.

6. The method of claim 1 wherein step (b) comprises for at least one of the selected cell types, identifying less than all of the pins of that cell type to be monitored.

7. The method of claim 6 wherein:

step (c) comprises for the at least one selected cell type, including in the list only the nodes in the netlist that correspond to the pins identified in step (b); and step (e) comprises for the at least one selected cell type, outputting logic states of only the nodes in the list included in step (c) within the functional model in response to the potential test vector.

8. The method of claim 7 wherein step (b) further comprises for the selected cell type:

(b)(1) reading a static power condition from the technology library for the selected cell type; and (b)(2) identifying the pins of that cell type that are listed in the static power condition as having a required logic state for the static power condition.

9. The method of claim 7 wherein, when the selected cell type comprises a memory cell, step (b) further comprises:

(b)(3) identifying all input address pins of the memory cell for monitoring.

10. The method of claim 1 wherein for each pin identified in step (b) for monitoring, step (c) comprises:

(c)(1) identifying a net name for a net coupled to that pin in the netlist;

(c)(2) locating any top net name within the netlist that is coupled to the net;

(c)(3) adding the top net name to the list if the top net name is located in step (c)(2); and (c)(4) adding the net name identified in step (c)(1) to the list if no top net name is located in step (c)(2).

11. The method of claim 10 wherein for each pin identified in step (b) for monitoring, step (c) further comprises:

(c)(5) marking the top net name if the top net name is added to the list in step (c)(4); and (c)(6) skipping steps (c)(3) and (c)(4) for that pin if the top net name has been previously marked in step (c)(5) for another of the pins identified in step (b) for monitoring.

12. A computer-aided design tool for analyzing static current test vectors for use in measuring static current consumed by an integrated circuit, the tool comprising:

means for reading a netlist of interconnected cells to identify cell types used within the netlist, wherein the netlist includes a plurality of nodes;

means for reading cell characteristics for selected ones of the cell types from a technology library to identify pins of the selected cell types to be monitored;

means for generating a list of the nodes in the netlist that correspond to the pins identified by the means for reading cell characteristics; and means for simulating a response of a functional model of the integrated circuit to a potential test vector and outputting logic states of the nodes in the list when the functional model is in a substantially steady state.

13. The computer-aided design tool of claim 12 wherein the netlist comprises at least one instance of a plurality of different cell types and wherein the means for reading the cell characteristics comprises:

means for comparing the plurality of different cell types against a predefined cell type criteria; and means for identifying only the cell types that satisfy the predefined cell type criteria and for reading the cell characteristics for at least one of those cell types from the technology library to identify pins of that cell type to be monitored.

14. The computer-aided design tool of claim 13 wherein the cell types that satisfy the predefined cell type criteria consist of only input-output buffers, tri-state buffers and the cell types that can potentially draw current when that cell type is in the substantially steady state.

15. The computer-aided design tool of claim 14 wherein the cell types that satisfy the predefined cell type criteria include memory cells, phase-locked loop cells and slew-rate buffers.

16. The computer-aided design tool of claim 13 wherein the means for reading cell characteristics comprises means for identifying less than all of the pins of at least one of the selected cell types to be monitored.

17. The computer-aided design tool of claim 13 wherein the means for reading cell characteristics comprises:

means for reading a static power condition from the technology library for the selected cell type; and means for identifying the pins of the selected cell type that are listed in the static power condition as having a required logic state for the static power condition.

18. The computer-aided design tool of claim 13 and further comprising, for each of the identified pins:
- (a) means for identifying a net name for a net coupled to that pin in the netlist;
- (b) means locating any top net name within the netlist that is coupled to the net;
- (c) means for adding the top net name to the list if the top net name is located; and
- (d) means for adding the net name identified in (a) to the list if no top net name is located in (b).

19. The computer-aided design tool of claim 18 and further comprising, for each of the identified pins:
- (e) means for marking the top net name if the top net name is added to the list in (c); and
- (f) means for inhibiting means (c) and means (d) if the top net name has been previously marked for another of the pins identified for monitoring.

20. A computer readable medium comprising instructions readable by a programmable computer which, when executed, cause the computer to perform steps comprising:
- (a) reading a netlist of interconnected cells to identify cell types used within the netlist, wherein the netlist includes a plurality of nodes;
- (b) for selected ones of the cell types, reading a technology library to identify any pins of the selected cell types that are listed as having a required logic state to place that cell type in a static power condition; and
- (c) generating an output computer file which lists the nodes in the netlist that correspond to the pins identified in step (b) and excludes at least some of the other pins of the selected cell types.

21. A method of analyzing test vectors for use in measuring static current consumed by an integrated circuit, the method comprising:
- (a) reading a netlist of interconnected cells to identify cell types used within the netlist, wherein the netlist includes a plurality of nodes;
- (b) identifying pins of selected ones of the cell types to be monitored;
- (c) for each pin identified in step (b):
  - (c)(1) identifying a net name for a net coupled to that pin in the netlist;
  - (c)(2) locating any top net name within the netlist that is coupled to the net;
  - (c)(3) adding the top net name to an output list if the top net name is located in step (c)(2); and
  - (c)(4) adding the net name identified in step (c)(1) to the output list if no top net name is located in step (c)(2);
- (d) simulating a response of a functional model of the integrated circuit to a potential test vector with a computer software simulation program; and
- (e) outputting logic states from the simulation program when the functional model is in a substantially steady state for the net names that are listed in the output list.

22. The method of claim 21 wherein for each pin identified in step (b), step (c) further comprises:
- (c)(5) marking the top net name if the top net name is added to the output list in step (c)(4); and
- (c)(6) skipping steps (c)(3) and (c)(4) for that pin if the top net name has been previously marked in step (c)(5) for another of the pins identified in step (b) for monitoring.

* * * * *